(12) United States Patent
Dede et al.

(10) Patent No.: US 11,552,308 B2
(45) Date of Patent: Jan. 10, 2023

(54) METHODS FOR MAKING TAILORED PERMEABILITY FUEL CELL BIPOLAR PLATES

(71) Applicant: Toyota Motor Engineering & Manufacturing North America, Inc., Plano, TX (US)

(72) Inventors: Ercan Mehmet Dede, Ann Arbor, MI (US); Tsuyoshi Nomura, Novi, MI (US); Yu Yang Song, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 988 days.

(21) Appl. No.: 16/275,394

(22) Filed: Feb. 14, 2019

(65) Prior Publication Data
US 2020/0266453 A1    Aug. 20, 2020

(51) Int. Cl.
*H01M 8/026* (2016.01)
*C25D 7/06* (2006.01)
(Continued)

(52) U.S. Cl.
CPC ............. *H01M 8/026* (2013.01); *B22F 10/80* (2021.01); *B33Y 50/00* (2014.12); *C25D 7/06* (2013.01);
(Continued)

(58) Field of Classification Search
CPC ..... H01M 8/026; H01M 8/0258; G06F 30/23; G06F 30/28
(Continued)

(56) References Cited

U.S. PATENT DOCUMENTS 7,781,122 B2    8/2010    Beutel et al.
7,872,563 B2    1/2011    Braun et al.
(Continued)

FOREIGN PATENT DOCUMENTS

CN    107579261 A    1/2018
KR    20180028625 A    3/2018

OTHER PUBLICATIONS

Dawson, et al., "The Use of Additive Manufacture for Metallic Bipolar Plates in Polymer Electrolyte Fuel Cell Stacks," Chemical Engineering Transactions, vol. 41, pp. 175-180 (2014).
(Continued)

*Primary Examiner* — James M Erwin
(74) *Attorney, Agent, or Firm* — Christopher G. Darrow; Darrow Mustafa PC

(57) ABSTRACT

Methods are provided for designing a microchannel layout for a flow field of a bipolar plate. The methods include defining a fluid flow optimization domain with boundary conditions and loads. Using a gradient-based algorithm together with computational fluid dynamics, the domain is then optimized for minimum flow resistance. The methods include setting the minimum inverse permeability to a non-zero value, and obtaining a grayscale design and fluid velocity field. Using Gray-Scott reaction diffusion equations with the grayscale design and fluid velocity field, the method includes obtaining a microchannel layout. The microchannel layout is then incorporated as a pattern for the flow field of the bipolar plate. In various aspects, anisotropic microchannels are provided; they may be formed using at least one of an additive manufacturing technique, a metal inverse opal electroplating technique, and a hybrid combination thereof.

20 Claims, 11 Drawing Sheets

(51) Int. Cl.
*B22F 10/80* (2021.01)
*G06F 30/23* (2020.01)
*G06F 30/28* (2020.01)
*B33Y 50/00* (2015.01)
*H01M 8/0258* (2016.01)
*B33Y 80/00* (2015.01)
*B33Y 10/00* (2015.01)

(52) U.S. Cl.
CPC .............. *G06F 30/23* (2020.01); *G06F 30/28* (2020.01); *H01M 8/0258* (2013.01); *B33Y 10/00* (2014.12); *B33Y 80/00* (2014.12)

(58) Field of Classification Search
USPC ........................................................ 429/514
See application file for complete search history.

(56) References Cited

U.S. PATENT DOCUMENTS

| | | |
|---|---|---|
| 2003/0231973 A1 | 12/2003 | Krumpelt et al. |
| 2004/0067405 A1 | 4/2004 | Turpin et al. |
| 2009/0162733 A1 | 6/2009 | Iverson et al. |
| 2011/0312080 A1 | 12/2011 | Hatton et al. |
| 2014/0272661 A1* | 9/2014 | Goebel ............... H01M 8/0254 429/514 |
| 2014/0329168 A1* | 11/2014 | Dang .................. H01M 8/0228 429/492 |
| 2015/0010840 A1* | 1/2015 | Roshanzamir ...... H01M 8/2457 429/437 |
| 2016/0093898 A1 | 3/2016 | Gould et al. |
| 2017/0194658 A1 | 7/2017 | Jin et al. |
| 2017/0229740 A1 | 8/2017 | Preezant |
| 2018/0195186 A1 | 7/2018 | Zhang et al. |

OTHER PUBLICATIONS

Lakshminarayanan et al., "Optimization of Flow Channel Design and Operating Parameters on Proton Exchange Membrane Fuel Cell Using MATLAB," Periodica Polytechnica Chemical Engineering, 60 (3), pp. 173-180 (2016).

Petrovic et al., "Thermal Performance Optimization in Electric Vehicle Power Trains by Locally Orthotropic Surface Layer Design," Journal of Mechanical Design, vol. 140, pp. 1-8 (2018).

Bordeu, "Labyrinthine Dissipative Patterns," Journal of Physics: Conference Series 720, pp. 1-10 (2016).

Chen, et al., "Novel flow field design for vanadium redox flow batteries via topology optimization," Elsevier, pp. 1-9 (2018).

Kim et al., "Forced Convection in Microstructures for Electronic Equipment Cooling," Journal of Heat Transfer, ASME; vol. 121, pp. 639-645 (Aug. 1999).

Wlodarczyk, "Porous Composite for Bipolar Plate in Low Emission Hydrogen Fuel Cells," Journal of Ecological Engineering, vol. 19, Issue 1, Jan. 2018, pp. 225-232, 2018 (8 pages).

U.S. Appl. No. 16/276,183, filed Feb. 14, 2019 (not yet published).
U.S. Appl. No. 16/524,421, filed Jul. 29, 2019 (not yet published).
U.S. Appl. No. 16/558,943, filed Sep. 3, 2019 (not yet published).

* cited by examiner

METHODS FOR MAKING TAILORED PERMEABILITY FUEL CELL BIPOLAR PLATES

TECHNICAL FIELD

The present disclosure generally relates to fuel cell bipolar plates and, more particularly, to methods for tailoring and customizing the permeability and/or flow fields of bipolar plates to control a fluid flow pattern from an inlet to an outlet.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Bipolar plates useful with fuel cell technology are designed to permit the transfer of air or fuel from an inlet, through a flow field, and to an outlet. The flow fields of the bipolar plates may include channels commonly formed by machining or stamping techniques. The efficiency of the chemical reaction within the fuel cell is based, in part, on the proper flow and distribution of air and fuel fluid flow streams. The fluid distribution is, in turn, based on the channel network and design. A uniform fluid flow is important to both performance and cost. Various designs of flow fields for bipolar plates often include portions with straight channels, and portions with channel designs that are manually optimized by using computational fluid dynamics in order to determine which portions of a flow field should be solid, and which portions should be provided for the fluid transfer. The manual optimization is both time consuming and costly.

Accordingly, it would be desirable to provide improved, cost effective bipolar plate designs and methods of manufacture that include an optimized fluid flow field distribution that can be customized.

SUMMARY

This section provides a general summary of the disclosure, and is not a comprehensive disclosure of its full scope or all of its features.

In various aspects, the present teachings provide a method for designing a microchannel layout for a flow field of a bipolar plate. The method includes defining a fluid flow optimization domain with boundary conditions and loads. Using a gradient-based algorithm together with computational fluid dynamics, the domain is then optimized for minimum flow resistance. The method includes setting the minimum inverse permeability to a non-zero value, and obtaining a grayscale design and fluid velocity field. Using Gray-Scott reaction diffusion equations with the grayscale design and fluid velocity field the method includes obtaining a microchannel layout. The microchannel layout is then incorporated as a pattern for the flow field of the bipolar plate.

In other aspects, the present teachings provide a method for designing an anisotropic microchannel layout for a flow field of a bipolar plate. The method includes defining a fluid flow optimization domain with boundary conditions and loads. Using a gradient-based algorithm together with computational fluid dynamics, the domain is then optimized for minimum flow resistance. The method includes setting the minimum inverse permeability to a non-zero value, and obtaining a grayscale design and fluid velocity field. Using Gray-Scott reaction diffusion equations and an anisotropic diffusion tensor along with the grayscale design and fluid velocity field, the method includes generating an anisotropic microchannel layout having a connected line and space pattern. The anisotropic microchannel layout is then incorporated as a pattern for the flow field of the bipolar plate. In various aspects, the method includes using a weak and strong anisotropic diffusion tensor set alternatively to solve the Gray-Scott reaction diffusion equations, and determining a spacing of microchannels based on effective medium theory.

In still other aspects, the present teachings provide a method for manufacturing a bipolar plate for a fuel cell. The method includes performing an interpolation process to design a flow distribution network. The interpolation process includes defining a fluid flow optimization domain with boundary conditions and loads. Using a gradient-based algorithm together with computational fluid dynamics, the domain is then optimized for minimum flow resistance. The method includes setting the minimum inverse permeability to a non-zero value, and obtaining a grayscale design and fluid velocity field. Using Gray-Scott reaction diffusion equations with the grayscale design and fluid velocity field, the method includes obtaining a variable pitch microchannel flow field layout. Using at least one of an additive manufacturing technique, a metal inverse opal electroplating technique, and a hybrid combination thereof, the method includes creating the variable pitch microchannel flow field layout configured to direct fluid from an inlet to an outlet of the bipolar plate.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
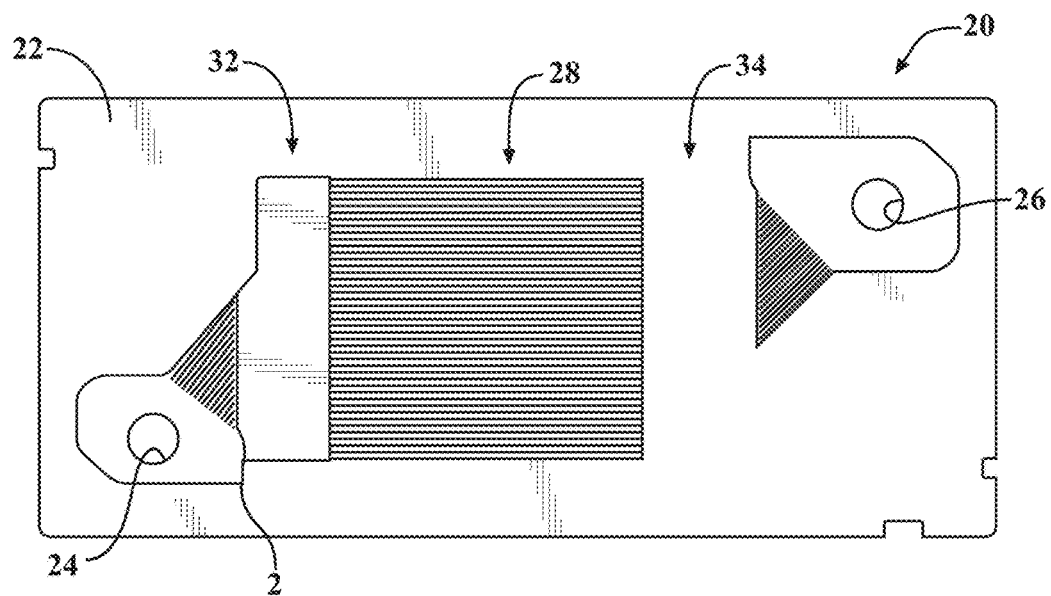
FIG. 1 illustrates a schematic plan view of an exemplary bipolar plate assembly for a fuel cell useful according to various aspects of the present technology.

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present technology generally teaches an optimized bipolar plate structure and/or assembly for a fuel cell, along with methods of design and manufacturing. The bipolar plates used in the structure and/or assembly can be provided with a flow field that can be designed with a plurality of microchannels to provide the bipolar plate with a tailored and customized porosity and permeability.

In various aspects, methods for designing a microchannel layout for a flow field of a bipolar plate include defining a fluid flow optimization domain with boundary conditions and loads. The methods may include performing an interpolation process to design a flow distribution network. Using a gradient-based topology algorithm, looped in together with fluid flow computational fluid dynamics, the domain is then optimized for minimum flow resistance (with optional mass flow rate constraints at fluid outlet boundaries) using a modified Darcy flow equation for porous media. In contrast to various topology optimization, a non 0-1 (solid-fluid) design is obtained with grayscale throughout the domain. For example, a material interpolation approach is used where the method includes setting the minimum inverse permeability to a non-zero value (with the maximum permeability representing a porous medium), and obtaining a grayscale design and fluid velocity field. Using Gray-Scott reaction diffusion equations with the grayscale design and fluid velocity field, the method includes obtaining a microchannel layout. The channel spacing can be based on effective medium theory for flow through porous media. In various aspects, the permeability of the optimized design space is linked to the microchannel design layout through an anisotropic definition of the diffusion coefficients of the Gray-Scott reaction diffusion equations in order to obtain an anisotropic microchannel layout. The use of present technology eliminates the explicit modeling of the microchannels. Instead, it derives a channel design using a computationally efficient post-processing technique based on the Gray-Scott equations and the velocity flow field through the porous medium.

The optimized design for the microchannel layout is then incorporated as a pattern for the flow field of the bipolar plate. For example, fabrication techniques can be used, in combination with the pattern, to create a network of functionally graded microchannels, a porous media, or a hybrid combination thereof. As will be described in more detail below, additive manufacturing techniques can be used where the flow field, or portion thereof, is fabricated using laser sintering, e-beam melting, and/or binder jet technology that may use a combination of printing and curing. Electroplating techniques may also be used for fabricating a functionally graded porous medium. A commercially available permeable material or functionally graded porous medium can be used. In other aspects, the porous medium can be custom made. In some examples, metal inverse opal technology can be used with a suitable metal, such as copper, nickel, or titanium. The functionally graded porous medium is generally obtained by templating polystyrene particles of different sizes, and/or controlling a sintering time for different templated regions. Conventional metal machining and/or stamping techniques can be used in combination with the above techniques to ultimately provide the bipolar plates.

FIG. 1 illustrates a schematic plan view of an exemplary bipolar plate assembly 20 that may be used with a fuel cell (not shown), such as a PEM fuel cell, according to various aspects of the present technology. Bipolar plate assemblies 20 are important components of PEM fuel cells, and have commonly been made of graphite or metals, such as stainless steel, aluminum, and titanium; composite bipolar plates have also been used. Bipolar plate assemblies 20 typically supply fuel and oxidant to reactive sites adjacent the membrane, remove reaction products, collect current produced by the internal reaction, and provide the necessary mechanical support for a plurality of fuel cells in a fuel cell stack.

By way of background, bipolar plate assemblies may include an anode flow field plate and a cathode flow field plate that have been bonded or otherwise appropriately sealed together as an assembly. In certain instances, they may be bonded to form a sealed coolant flow field between the plates, as commonly employed in the art. Various transition channels, ports, ducts, and other features involving all three operating fluids (i.e. fuel, oxidant, and coolant) may also appear on the inactive side and other inactive areas of bipolar plate assemblies. The operating fluids may be provided under significant pressure, thus it is important that all of the features in the plates are appropriately sealed to prevent leaks between the fluids and to the external environment. Another feature for bipolar plate assemblies is that there is a satisfactory electrical connection between the two plates because a substantial current generated by the fuel cell stack must be able to pass between the two plates.

The plates making up the assembly may optionally be metallic and are typically produced by stamping the desired features into sheets of appropriate metal materials (e.g. certain corrosion resistant stainless steels). Two or more stamped sheets are then typically welded or clamped together with gaskets so as to appropriately seal all the fluid passages from each other and from the external environment. Additional welds may be provided to enhance the ability of the assembly to carry electrical current, particularly opposite the active areas of the plates. Metallic plates may however be bonded and sealed together using adhesives or the aforementioned gaskets. Corrosion resistant coatings are also often applied before or after assembly.

In other aspects, the present technology provides monolithic and/or hybrid structure bipolar plate assemblies. As used herein, the term "monolithic" means a single, unitary component that is intractably indivisible once formed. While there may be an interface region where two or more components are joined together by bonding or some type of fusion, once the materials are bonded/fused to one another, the materials do not typically separate from one another as may occur in other layered substrates. The bipolar plates may include porous materials and functionally graded materials as a base structure, and/or may include portions that include a material created by additive manufacturing techniques, electroplating techniques, and the like. As used herein, the term "hybrid" structure means a structure that includes more than one type of material or structure, for example, one non-limiting aspect may include a first portion including a porous medium, and a second portion with explicit microchannels, which may be created by additive manufacturing techniques, electroplating techniques, and the like. In other non-limiting aspects, a hybrid porous structured material may include a first portion/region that is non-porous, and a second portion/region that is porous with a certain permeability. The design and manufacturing of monolithic and hybrid structure types of bipolar plates and/or bipolar plate assemblies made with additive manufacturing techniques and electroplating techniques will be described in more detail below.

With renewed reference to FIG. 1, the structure of the bipolar plate assembly 20 generally includes at least one basic support substrate or bipolar plate structure 22 defining one or more inlet 24 and outlet 26, and a flow field 28 that cooperates with the bipolar plate assembly 20 providing fluid communication between a respective inlet 24 and outlet 26. The flow field 28 may be provided with one or more different regions having a respective shape or pattern that defines a plurality of channels 30, or microchannels, sized and configured to provide the appropriate fluid communication. While one or more of the regions may be provided with generally straight, parallel, and/or serpentine style flow channels, in various aspects, certain of the channels and/or portions of the flow field, such as the inlet region 32 and/or outlet region 34, may be shaped and oriented in order to specifically minimize flow resistance to provide a minimal fluid power/pressure drop or to provide a uniform flow field across the plurality of microchannels. In addition to providing fluid communication between an inlet 24 and a respective outlet 26, the channels 30 may serve as a support structure for other components and the membrane, and provide fluid transfer of the fuel and air to a respective anode diffusion layer and a cathode diffusion layer, which are then directed to the catalyst layers and reaction sites.

Figure 2:
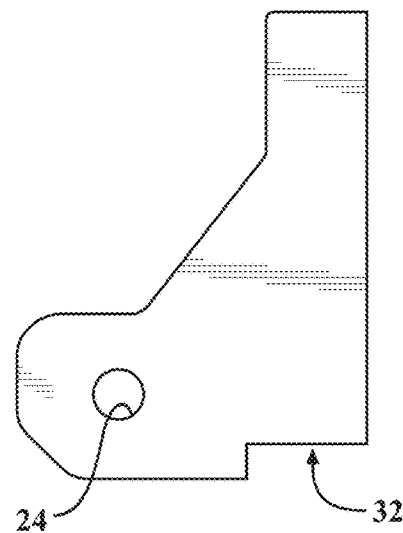
FIG. 2 is a magnified view of a portion of the bipolar plate assembly of FIG. 1 represented by the shape labeled with reference number 2.
Figure 3:
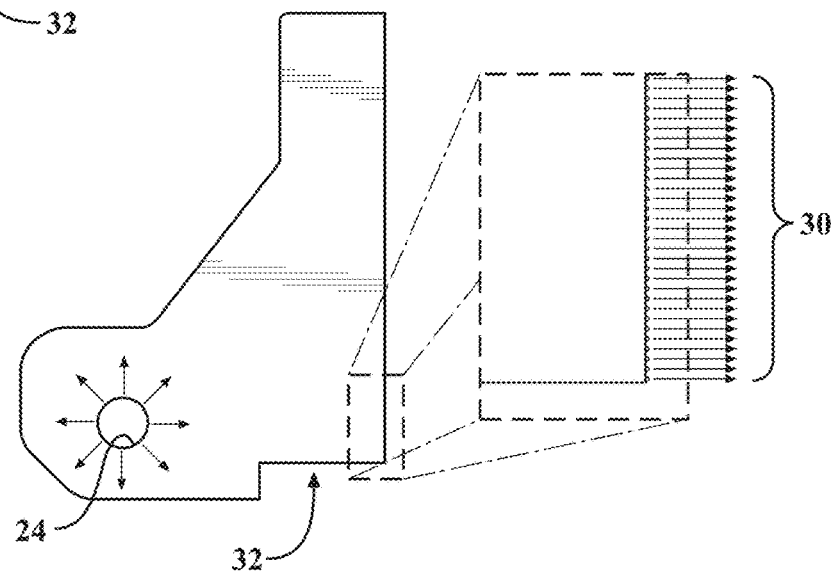
FIG. 3 is an alternate view of the portion of the bipolar plate assembly of FIG. 2 provided with a simplified inlet design and illustrating a magnified portion of a flow field inlet region.

FIG. 2 is a magnified view of a portion of the bipolar plate assembly 20 of FIG. 1 represented by the shape labeled with reference number 2. The portion shown in FIG. 2 includes an inlet 24 and the inlet region 32 of the flow field 28. As shown in FIG. 3, for ease of design, modeling, and explanation herein, the inlet 24 is simplified as having a circular shape that is then used for obtaining the domain and data for optimization described herein. The present technology generally focuses on the design of a flow pattern and microchannel designs of the inlet region 32 of the flow field 28, as shown in FIG. 2, so that it can be designed and configured with a plurality of microchannels to provide the inlet region 32 of the bipolar plate with a tailored and customized porosity and permeability. In broad terms, porosity is generally a measure of how much of a substrate is open space. This open space can be, for example, between grains or within cracks, cavities, and/or channels provided within or on a surface of the substrate. Permeability is generally a measure of the ease with which a fluid can move through the porous substrate.

Figure 4:
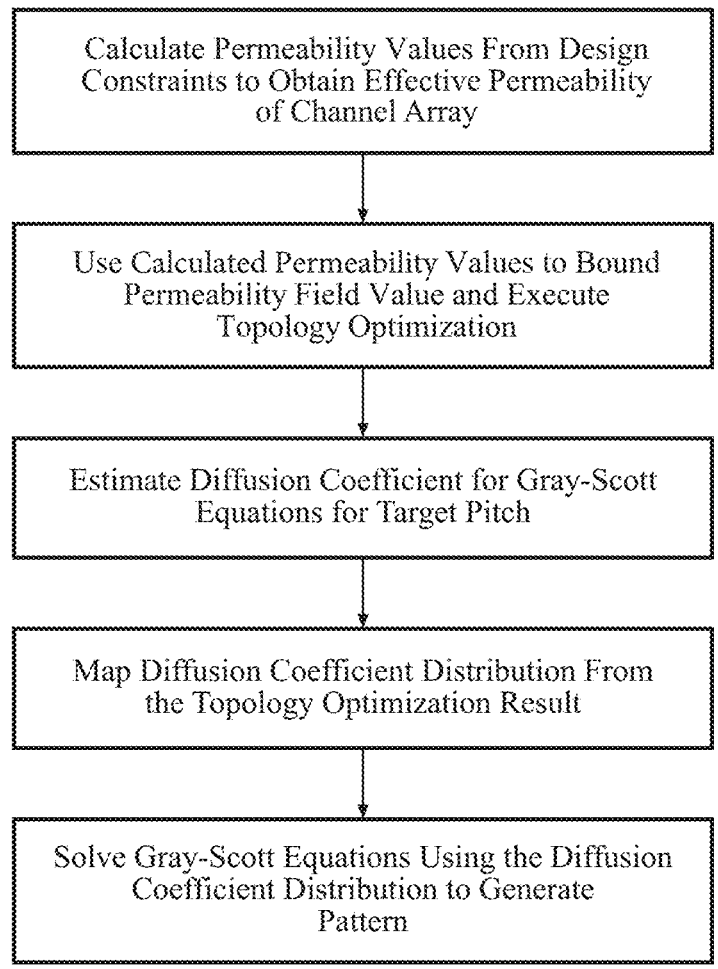
FIG. 4 illustrates an exemplary schematic flow chart for designing a pattern for an inlet region of a flow field.
Figure 5:
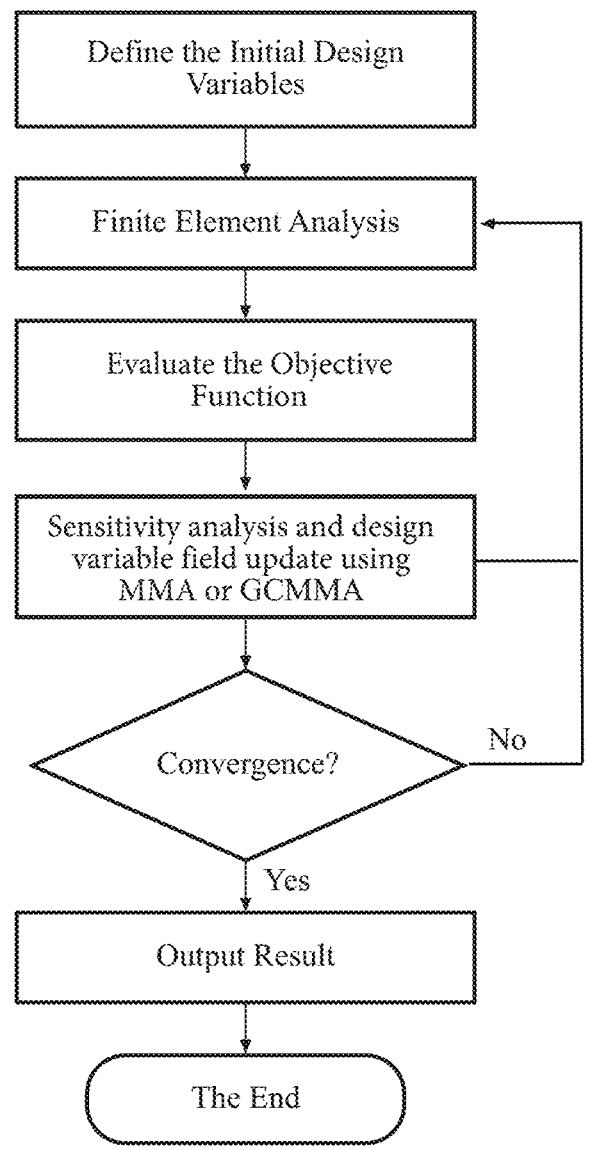
FIG. 5 is a flowchart of an exemplary gradient based algorithm using method of moving asymptotes (MMA) or globally convergent method of moving asymptotes (GCMMA) looped in with the fluid flow CFD to optimize the domain.
Figure 6:
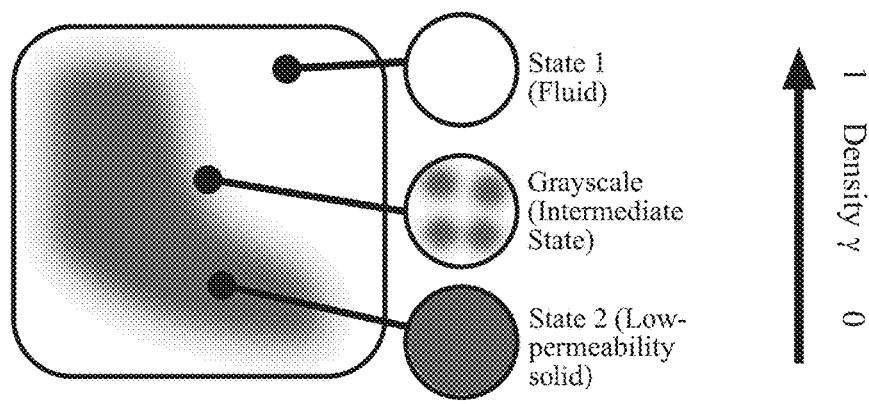
FIG. 6 provides a schematic illustration a fictitious design variable of density τ that may be introduced to relax the topology optimization problem and provide a numerical framework to establish flow optimization.

FIG. 4 provides an exemplary schematic flow chart for designing a pattern for an inlet region of a flow field. The method may begin with calculating minimum and maximum permeability values from design constraints in order to obtain an effective permeability of a channel array. The fluid flow optimization domain, boundary conditions, and loads may be defined. Minimum and maximum values to bound the permeability field value may be used to execute topology optimization. As is known in the art, topology optimization is a mathematical method that optimizes a material layout within a specific design space, based on a particular set of loads, boundary conditions, and constraints, in order to maximize the performance of the specific system. In various aspects, a gradient-based algorithm, together with CFD, may be used to optimize the domain for minimum flow resistance. FIG. 5 is a flowchart of an exemplary gradient-based algorithm using method of moving asymptotes (MMA) or globally convergent method of moving asymptotes (GCMMA) looped in with the fluid flow CFD to optimize the domain. In this instance, the optimization determines where in a flow field design domain to place the channels and where to place the fluid. In various aspects, results obtained from certain topology optimizations can be directly manufactured using various additive manufacturing techniques. For the topology optimization, one general approach is to represent a structural configuration by a material presence at each point. As such, the present technology provides a flexible method for design of fluid flow manifolds under laminar flow considerations. With reference to FIG. 6, a fictitious design variable of density γ may be introduced to relax the problem and provide a numerical framework to establish flow optimization. FIG. 6 shows the various possibilities, with γ=1 representing a fluid state (essentially white in FIG. 6), γ=0 representing a solid or low-permeability solid, or solid (essentially black in FIG. 6). The grayscale coloring in FIG. 6 represents an intermediate state with 0<γ<1, somewhere between a fluid state and a solid state. Topology optimization is then applied to the solid-fluid manifold design problem.

Based on the incompressibility condition of ∇·u=0, where u is the fluid velocity, one can arrive at the Navier-Stokes equation for flow through a porous medium, as follows:

$$\rho(u \cdot \nabla u) = -\nabla P + \nabla\{\eta[\nabla u + (\nabla u)^T]\} - \kappa_e(\gamma)u$$

where $\kappa_e$ represents the effective inverse permeability. The effective inverse permeability (convex) interpolation may then be provided as follows, with permeability as a function of γ, the design variable:

$$\kappa_e(\gamma) = \kappa_{min} + (\kappa_{max} - \kappa_{min})\frac{q(1-\gamma)}{q+\gamma}$$

Methods of designing a microchannel layout for the inlet region 32 of a flow field begin with defining a fluid flow optimization domain with boundary conditions and loads. A gradient-based algorithm may then be used, together with computational fluid dynamics (CFD), to optimize the domain for minimum flow resistance. FIG. 5 illustrates the use of finite element analysis to update design variables using an exemplary method of moving asymptotes (MMA) or a globally convergent method of moving asymptotes (GCMMA) algorithm that is looped in with the fluid flow CFD. In various aspects, the methods for minimizing the flow resistance include minimizing the fluid power and/or pressure drop. For the fluid inlet boundary conditions, a first option includes a specified velocity and a second option includes a zero pressure; other conditions such as a specified mass flow rate are possible, as well. For the fluid outlet boundary conditions, the first option includes a zero pressure, and the second option includes a specified velocity. Subject to a solid material volume constraint, for example 50%, the objective function F to minimize is based on the following relationship:

$$F_o = \int_\Omega \left[\frac{1}{2}\eta \sum_{i,j}\left(\frac{\partial u_i}{\partial x_j} + \frac{\partial u_j}{\partial x_i}\right)^2 + \sum_i \kappa_e(\gamma)u_i^2\right] d\Omega$$

The function generally represents the quantity that is being minimized for best performance, here that is the minimization of flow resistance across the structure for better efficiency. Minimization of flow resistance is important because it is directly related to pumping power. In various aspects, the design space Ω may be defined to provide regions that cannot be modified during the course of the optimization. Evaluation of the objective function can be performed solving differential equations using a finite element method or similar computational approach.

Figure 7:
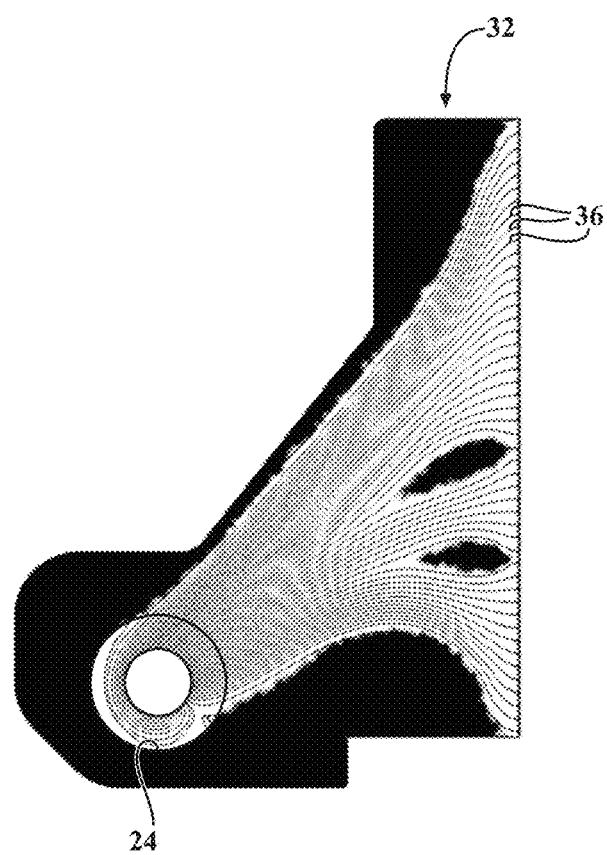
FIG. 7 provides an illustration of a flow field with the inverse permeability $\kappa_{min}$ being equal to zero, and represents a strictly black & white (0, solid and 1, fluid) design.
Figure 8:
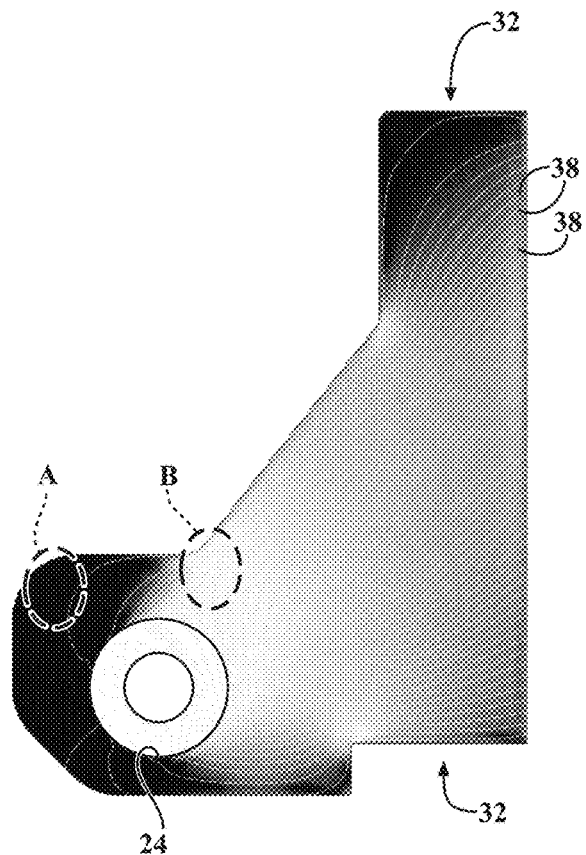
FIG. 8 provides an illustration of an exemplary grayscale design representing a porous medium with the inverse permeability $\kappa_{min}$ being equal to one third of the maximum, for example, $\kappa_{min}$=0.333 $\kappa_{max}$.

FIGS. 7 and 8 illustrate the comparison between traditional topology optimization and porous media design. FIG. 7 provides the situation with the inverse permeability $\kappa_{min}$ being equal to zero, and represents a strictly black & white (0, solid and 1, fluid) design, illustrating pure fluid flow from the inlet 24 shown with fluid streamlines, generally represented by reference number 36 that, as shown, exits via roughly 146 outlets (each outlet is not separately shown). One issue that arises with the configuration of FIG. 7, however, is that when there is a large open volume for a flow channel (pure fluid), there is no structure available to support other components of the fuel cell, such as the membrane. Methods of the present technology include setting the minimum inverse permeability to a non-zero value, and obtaining a grayscale design and fluid velocity field. FIG. 8 provides an exemplary grayscale design representing a porous medium with the inverse permeability $\kappa_{min}$ being equal to one third of the maximum, for example, $\kappa_{min}$=0.333 $\kappa_{max}$, so there is not any area that is a pure fluid, instead it is all porous. The grayscale of FIG. 8 is now representative of the porous medium fluid flow from the inlet 24 via the tailored permeability fluid streamlines, generally represented by reference number 38, that essentially exits via one outlet.

In various aspects, an effective medium theory approach may be used in order to obtain a width / channel spacing of the microchannels. For example, a functionally graded porous flow medium can be translated into a microchannel network, where the permeability of the porous medium contains embedded information about microchannel dimensions.

Traditional topology optimization does not retain microchannels. However, the present technology utilizes information embedded in the inverse permeability field to guide the relative design of the microchannel structure in order to obtain fine scale features. For example, the inverse permeability can provide a relationship between porous media and microchannel design utilizing an effective medium approach where, for example, the microchannel spacing scales with the square of the channel width. It should be noted that other scale functions may be contemplated. In this regard, the full Navier-Stokes approach is employed for narrow channels for the water flow assessments. Each microchannel can be modeled as a fluid-saturated porous medium, numerically solved using the modified Forchheimer-Brinkman-extended Darcy equation for the fluid flow:

$$-\frac{d}{dx}\langle p\rangle_f + \mu_f \frac{d^2}{dy^2}\langle u\rangle_f - \frac{\mu_f}{K}\epsilon\langle u\rangle_f = 0$$

which leads to the following relationships:

$$\epsilon = \frac{w_c}{w}, K = \frac{\epsilon w_c^2}{12}, k_{se} = (1-\epsilon)k_s, k_{fe} = \epsilon k_f$$

See, e.g., S.J. Kim, D. Kim, Forced convection in microstructures for electronic equipment cooling, ASME J. Heat Transfer 121 (1999) 635-645. The approach can be utilized to provide a relationship of permeability K as a function of the microchannel width $W_c$ and porosity ε where $\kappa_{se}$, $\kappa_s$, $\kappa_{fe}$, and $\kappa_f$ are the effective thermal conductivity of solid, thermal conductivity of the solid, effective thermal conductivity of fluid, and thermal conductivity of fluid, respectively. In this regard, the microchannel pitch/spacing is logically linked to the permeability of the design porous material layout; for example, it directly relates the microstructure of the porous material to the dimensions of a channel structure.

Once the grayscale design and fluid velocity fields are obtained, in various aspects, exemplary methods include using the Gray-Scott reaction diffusion equations in order to model and obtain a microchannel layout, for example, to obtain generate a variable pitch microchannel pattern. Once a microchannel layout is obtained, it can be used as a pattern for a flow field area of a bipolar plate.

As is known in the art, reaction-diffusion systems are mathematical models that correspond to physical phenomena. In one example, a change in space and time of the concentration of one or more chemical substances is modeled. In mathematical terms, reaction-diffusion systems generally take the form of semi-linear parabolic partial differential equations represented by the general form as follows:

$$\partial_t q = \underline{D}\nabla^2 q + R(q),$$

where q(x, t) represents the unknown vector function, D is a diagonal matrix of diffusion coefficients, and R accounts for all local reactions. Reaction and diffusion of chemical species can produce a variety of patterns, reminiscent of those often seen in nature. The Gray-Scott equations model such a reaction and are generally provided as follows:

$$\frac{\partial u}{\partial t} = D_u \nabla^2 u - uv^2 + F(1-u),$$

$$\frac{\partial v}{\partial t} = D_v \nabla^2 v + uv^2 - (F+k)v.$$

The partial differential equations modeling this process may be simulated with a variety of numerical techniques. In various aspects, good results can be obtained using methods such as forward Euler integration of the finite-difference equations that one obtains by spatial discretization of the Laplacian, or the diffusion coefficients can be estimated for a target pitch/spacing. For example, in various aspects the value of (pitch)^2 (i.e. the square of the microchannel width) can be used to approximate the diffusion coefficient.

The Gray-Scott reaction diffusion model is a mathematical model that describes the behavior of two chemical substances, and calculates the concentration of the two substances at a given time based upon the substances diffusion, feed rate, removal rate, and a reaction between the two. This simulation not only models the underlying process of a chemical reaction, but can also result in patterns of the substances that are remarkably similar to patterns found in nature. Examples include patterns on animals, such as stripes on zebras, a leopard's skin, spots on butterflies, patterns on fish; fingerprints; ripples on sand; patterns of veins on a leaf; and various other biological phenomena. With the present technology, certain of the patterns resulting from this model can be used for the design of at least a portion of a flow field of a bipolar plate.

To illustrate the model, one analogy presented is to imagine an area or space containing various concentrations of each chemical substance U and V at time zero. Over time, substance U is fed into the reaction at a given rate, while substance V is removed at a given rate. Further, two molecules of V can react with one of U, which converts the substance of U to V as follows:

U, V, and P are chemical substances. A simulation is accomplished using the two partial differential equations listed above, each representing the change in concentration of a substance over time, where u and v are independent variables that represent their respective concentrations; $D_u$ and $D_v$ are their respective diffusion rates or diffusion tensors, which can be calculated from permeability. The parameter κ represents the rate of conversion of V to P; and F represents the rate of process that feeds U and drains U, V, and P. The parameters k and F are arbitrary positive numbers that can be adjusted. Each diffusion tensor is generally a 3×3 matrix reflecting diffusion rates in different directions.

The change in u (upper partial differential equation) is dependent upon its reaction with v (hence the subtraction (−) of uv²) and is fed at a certain rate (+F, scaled to its current concentration). The change in v (lower partial differential equation) is dependent upon its reaction with u (hence the addition (+) of uv²), and is removed at a given rate (−k, scaled by the feed rate and concentration of V). The concentration of U or V at each position is updated at each time increment (typically 1) based upon the result of the corresponding equation. The values for the feed rate, removal rate, and diffusion rate are entered into the equations. For example, on a 2D grid, the Laplacian Operator could be calculated on a convolution matrix. To calculate the new concentration, the current concentration and each surrounding concentration is multiplied by the corresponding value in the matrix (where the current position corresponds to the center position in the convolution matrix) and all values summed. This value technically represents the difference in concentrations between the current position and the surrounding positions.

The above model can be programmed in a suitable computer code as is known in the art. In various aspects, the resulting model provides an image representing the reaction container, with each point or pixel of the image representing the concentration of V (v) at that position. For example, the Gray-Scott reaction diffusion equations can be solved with various numerical methods, such as the finite differential method or the finite element method. The initial value of u and v could be random noise distribution. By solving the Gray-Scott equations for some time period with an appropriate parameter set, a steady state is obtained. Then, the obtained distribution is interpreted as a channel structure. For instance, u>th may represent the wall domain and u<th may represent the channel domain, where th is a threshold value.

Figure 9:
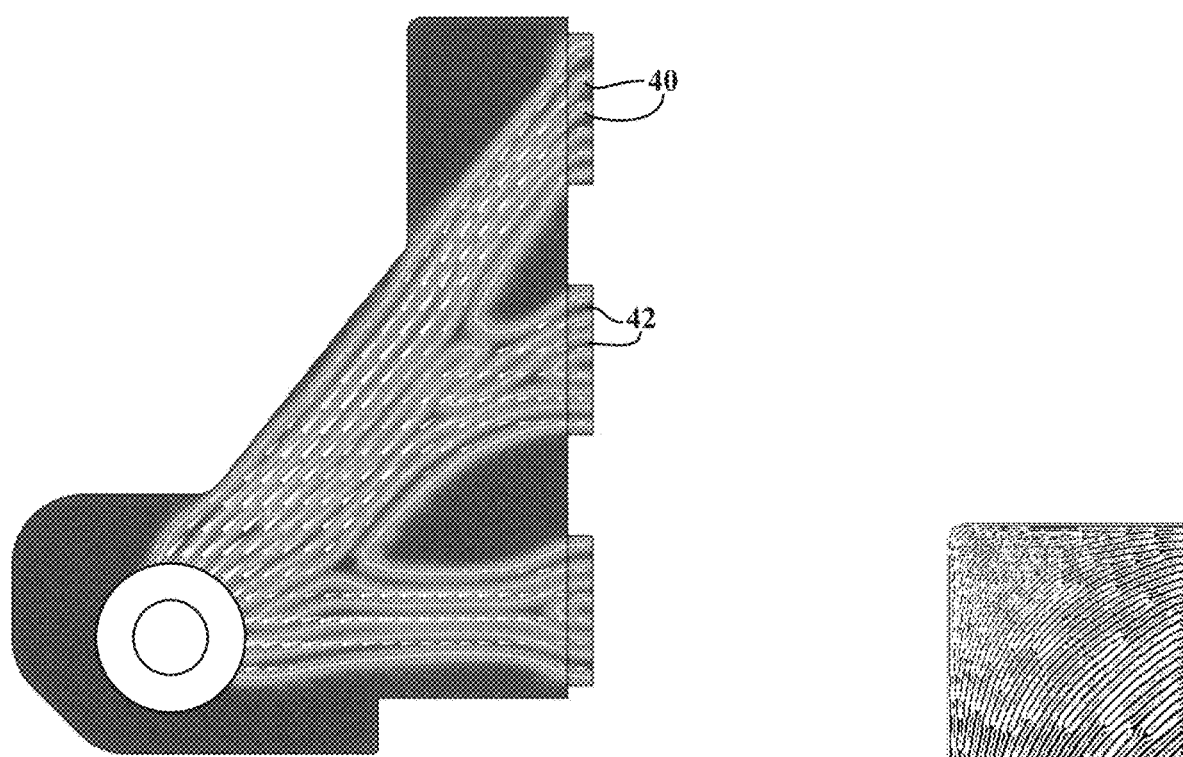
FIG. 9 illustrates an inlet region of a flow field provided with three pre-defined outlets, where microchannels only exist in the designed fluid domain.
Figure 10:
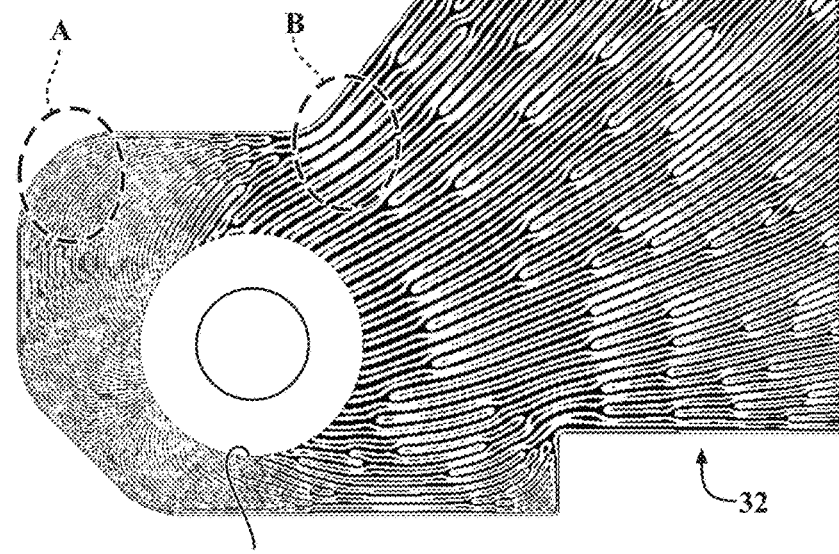
FIG. 10 illustrates an inlet region of a flow field provided with microchannels designed throughout, with pitch varying based on effective medium permeability.

Notably, the diffusion tensor is coupled with the permeability distribution of the flow system to be designed. For example, the permeability distribution is projected to the channel pattern with a variable array pitch through the diffusion coefficient distribution of the Gray-Scott equations. FIG. 9 illustrates an inlet region of a flow field provided with three pre-defined outlets, where microchannels only exist in the designed fluid domain. FIG. 10 illustrates an inlet region of a flow field provided with microchannels designed throughout, with pitch varying based on effective medium permeability. The circles A and B in FIGS. 8 and 10 illustrate, by way of non-limiting examples, of certain areas of the flow field that may be provided with a fine pitch, represented by circle A, and with a coarse pitch, represented by circle B.

Figure 11:
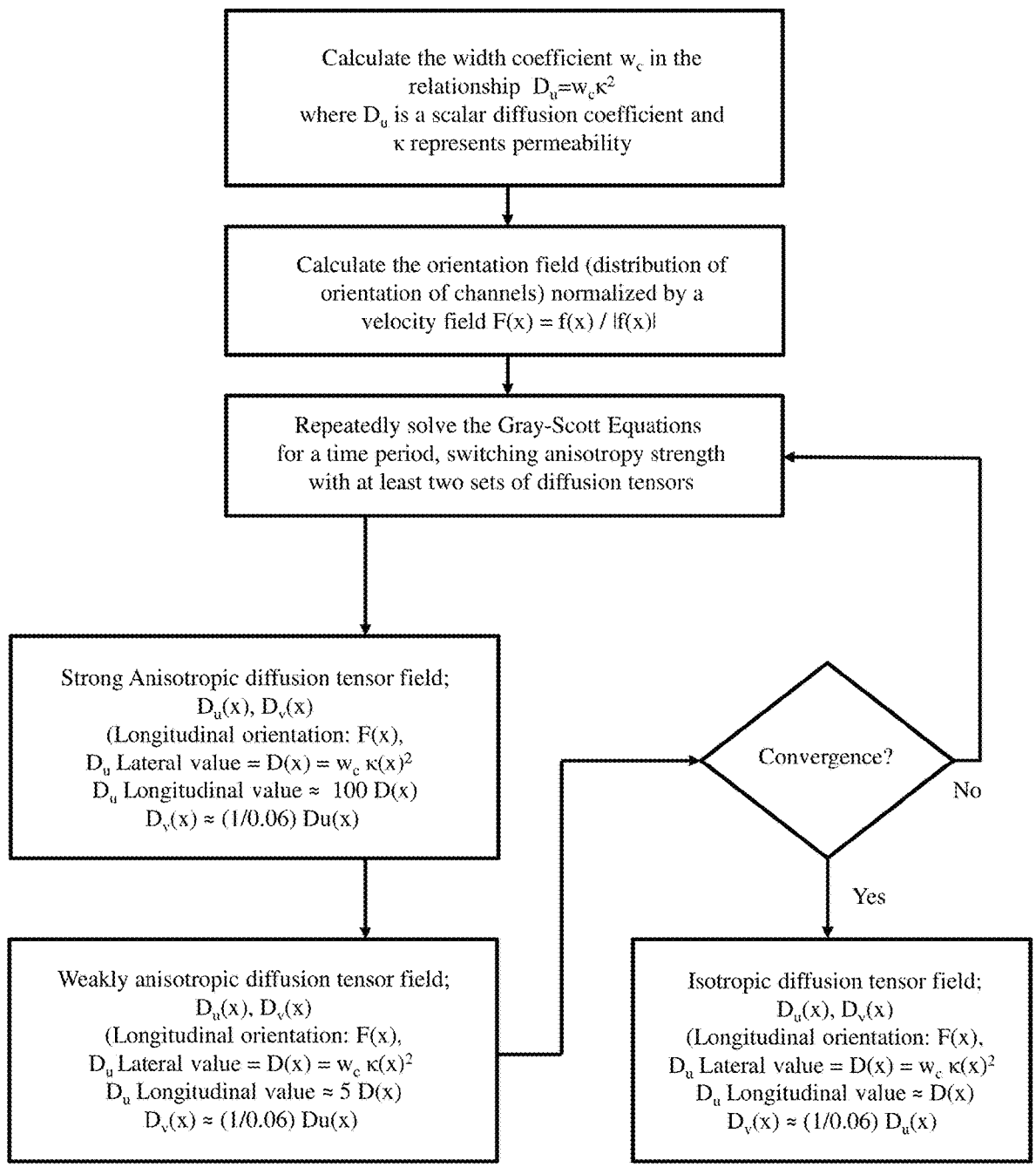
FIG. 11 illustrates an exemplary method flow chart for designing a pattern for an inlet region of a flow field using an anisotropic diffusion tensor.

In various aspects, the present technology may use the Gray-Scott reaction diffusion equations with the grayscale design and fluid velocity field to obtain an anisotropic microchannel layout. This may include using an anisotropic diffusion tensor with the Gray-Scott equations. FIG. 11 illustrates an exemplary method flow chart for designing a pattern for an inlet region of a flow field using an anisotropic diffusion tensor. As shown in FIG. 11, (x) means position dependent. The first execution of a strong anisotropic diffusion tensor field may generate a rough line and space pattern with a poor fill factor due to the large diffusion value.

The second and later executions reduce defects, such as unnecessary walls and bends or very short branches. In certain aspects, the weakly anisotropic diffusion tensor field can be an isotropic diffusion tensor field; both weakly anisotropic and isotropic diffusion tensor fields improve the fill factor.

Figure 12:
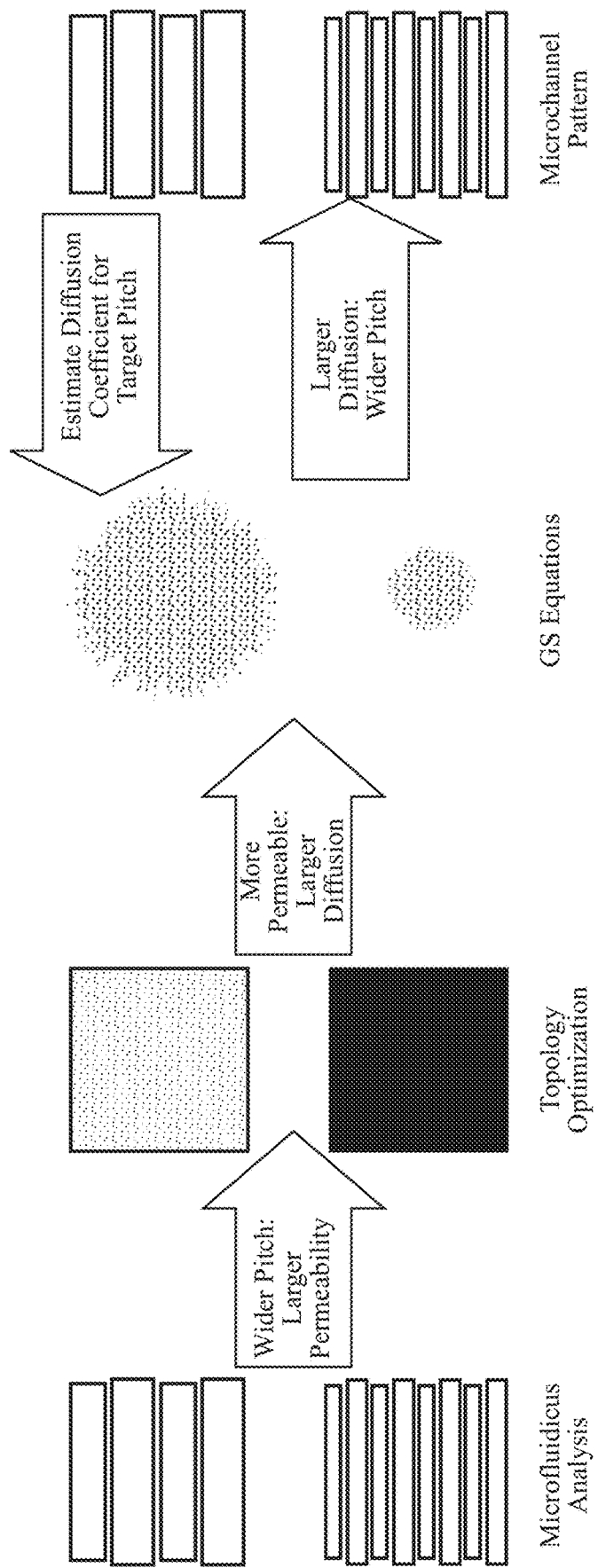
FIG. 12 illustrates an exemplary schematic generally summarizing the methods for designing a pattern for an inlet region of a flow field.

In various aspects, a weak and strong anisotropic tensor set is alternatively used to obtain the connected line and space pattern, along with the flow direction. With an isotropic diffusion tensor, the ratio of the microchannel pitch (a) to the length (b) can be represented as a:b =1:1. For a weakly anisotropic tensor, the ratio of a:b is between about 1:1 to about 1:5. For a strongly anisotropic tensor, the ratio of a:b may be up to about 1:100. As noted in FIG. 11, the lateral direction defines the channel pitch. By stretching the tensor in the longitudinal direction, which is the flow direction, the line and space pattern can be obtained. In various aspects, at least two sets of diffusion tensors are used to repeatedly solve the reaction diffusion equations: an isotropic or weakly anisotropic set, and a strongly isotropic set. In various methods, the Gray-Scott equations may be solved for some time period, where the diffusion tensor sets alternate in strength from weak to strong. For example, the diffusion tensor may be switched from isotropic →anisotropic→isotropic. This may be repeated several times, preferably finishing with either a weakly anisotropic set or completely isotropic set. FIG. 12 illustrates an exemplary schematic generally summarizing methods for designing a pattern for an inlet region of a flow field.

Figure 13:
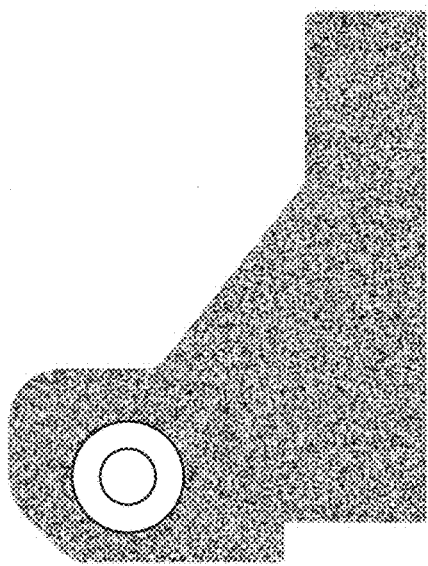
FIG. 13 illustrates an initial random pattern obtained from the Gray-Scott equations.
Figure 14:
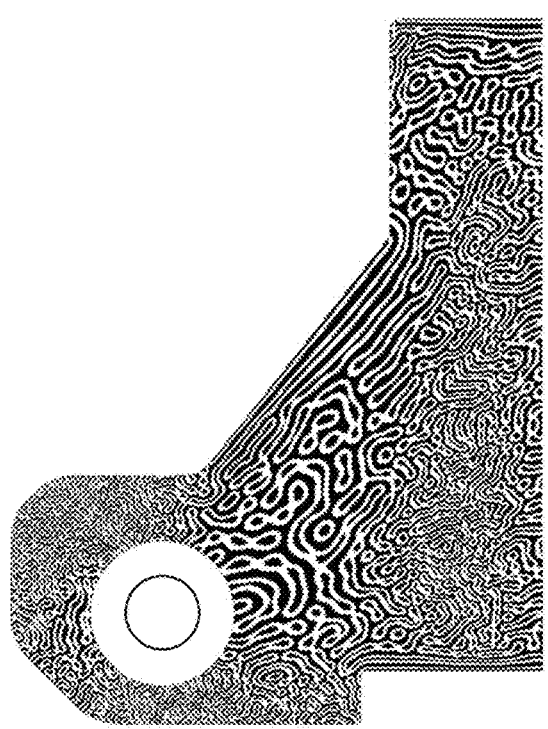
FIG. 14 illustrates an inlet flow field using a single isotropic diffusion tensor set obtained from the Gray-Scott equations, with a ratio of a:b as 1:1.
Figure 15A:
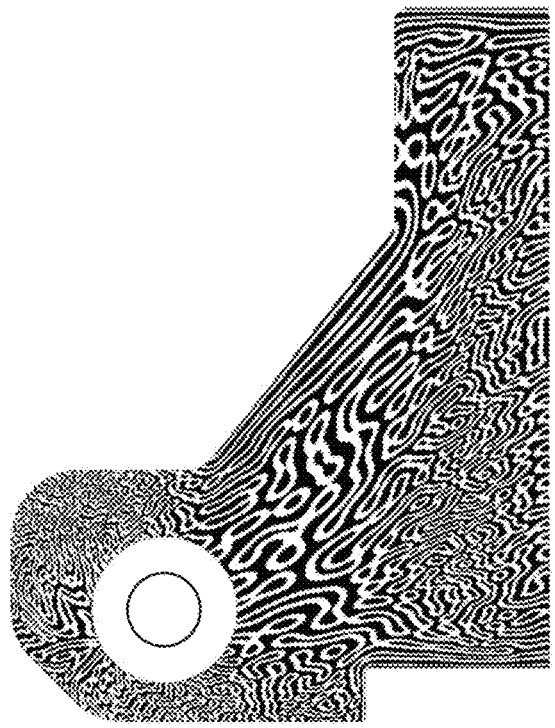
FIG. 15A illustrates an inlet flow field using a single weakly anisotropic diffusion tensor set obtained from the Gray-Scott equations, with a ratio of a:b as 1:5.
Figure 15B:
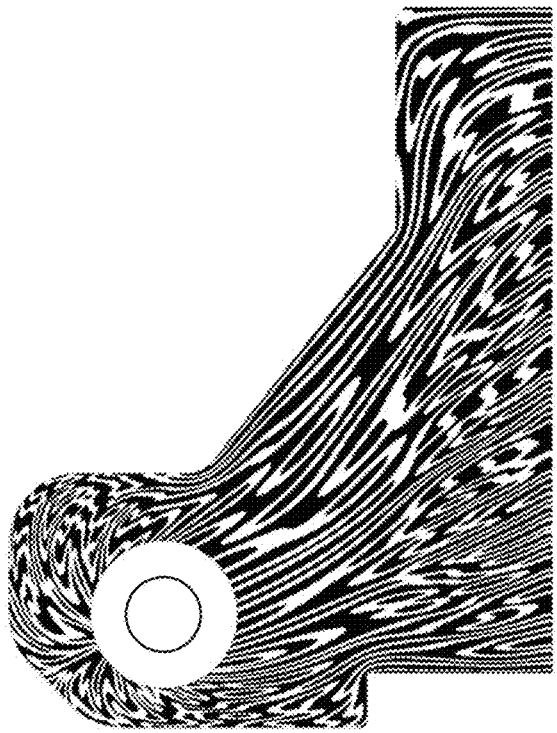
FIG. 15B illustrates an inlet flow field using a single strongly anisotropic diffusion tensor set obtained from the Gray-Scott equations, with a ratio of a:b as 1:100.
Figure 16A:
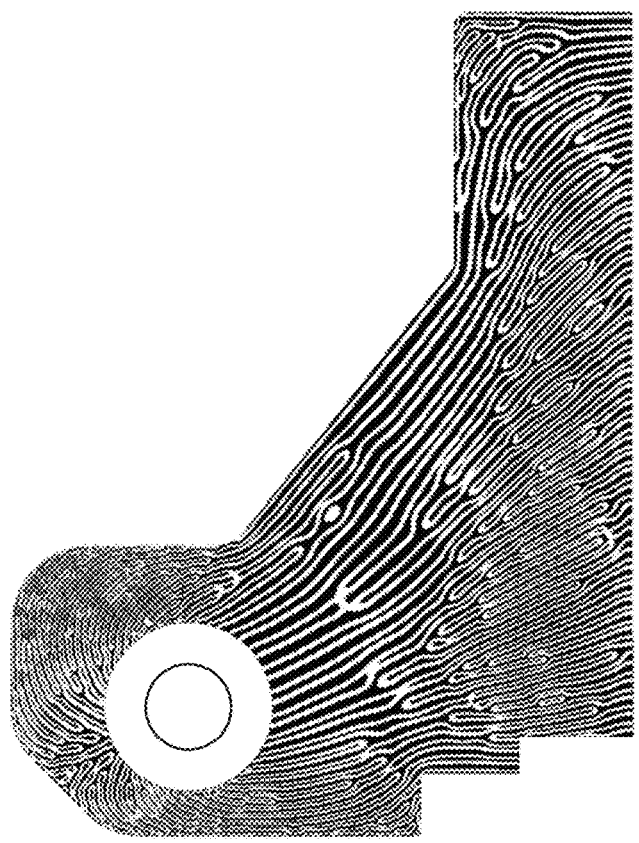
FIG. 16A illustrates an inlet flow field using a combination of diffusion tensor sets, alternating from strongly anisotropic to isotropic.
Figure 16B:
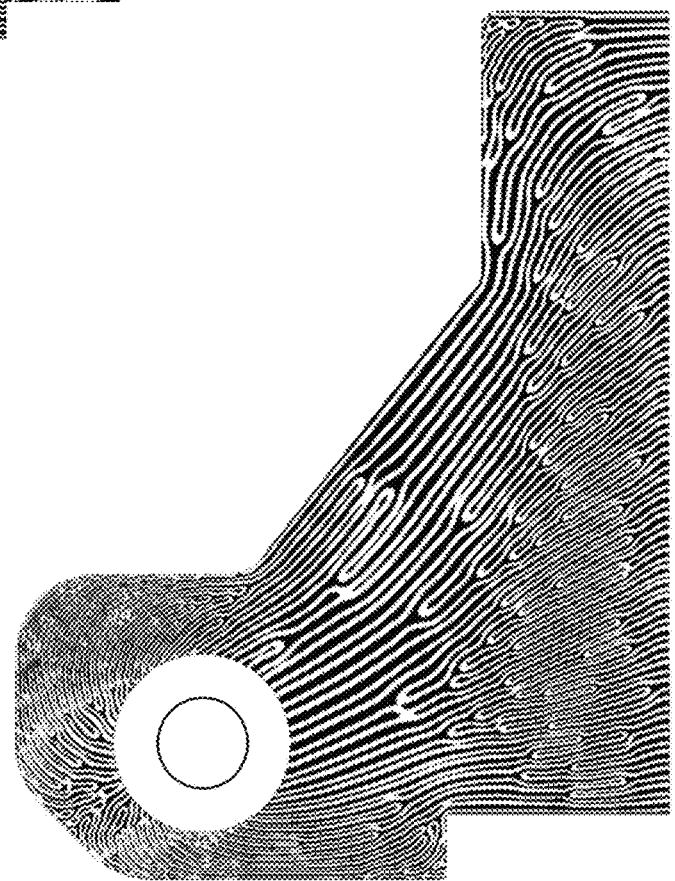
FIG. 16B illustrates an inlet flow field using a combination of diffusion tensor sets, alternating from isotropic, to strongly anisotropic, to isotropic.
Figure 16C:
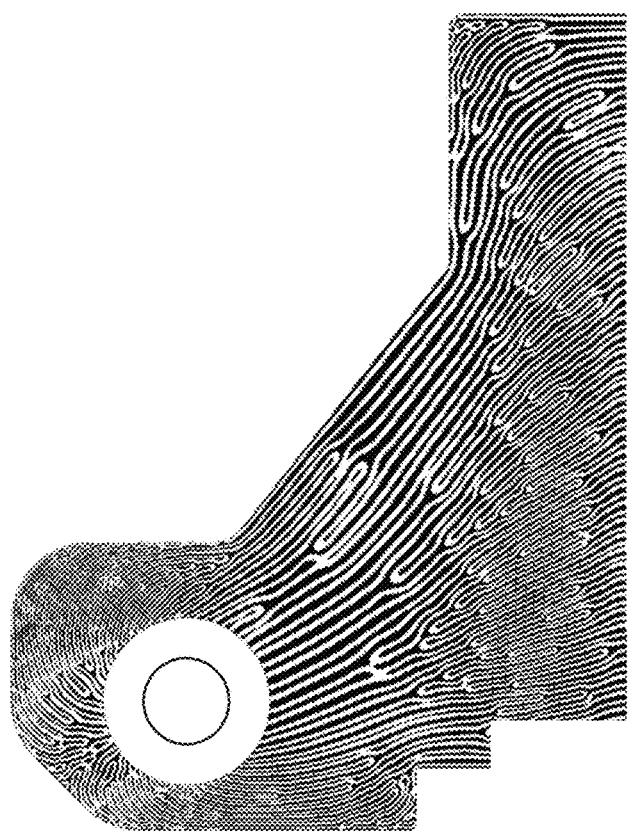
FIG. 16C illustrates an inlet flow field using a combination of diffusion tensor sets, alternating from strongly anisotropic, to isotropic, to strongly anisotropic, back to isotropic.
Figure 16D:
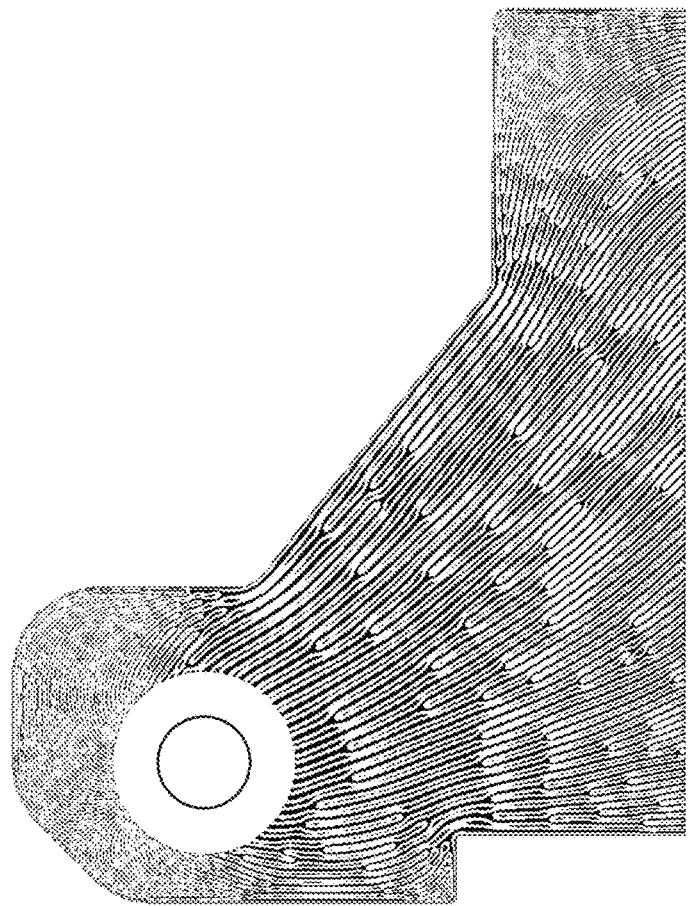
FIG. 16D illustrates an inlet flow field using a combination of diffusion tensor sets resulting in an optimized microchannel design.

FIGS. 13-16 are provided herein to show the differences in design of the flow field based on the type of diffusion tensor(s) used. FIG. 13 illustrates an initial random pattern obtained from the Gray-Scott equations. FIGS. 14 and 15 use a single diffusion tensor. For example, FIG. 14 illustrates an inlet flow field using a single isotropic diffusion tensor set obtained from the Gray-Scott equations, with a ratio of a:b as 1:1. In contrast, FIG. 15A illustrates an inlet flow field using a single weakly anisotropic diffusion tensor set obtained from the Gray-Scott equations, with a ratio of a:b as 1:5, and FIG. 15B illustrates an inlet flow field using a single strongly anisotropic diffusion tensor set obtained from the Gray-Scott equations, with a ratio of a:b as 1:100. FIGS. 16A-16C provide illustrations of a flow field with a combination of diffusion tensors. FIG. 16A illustrates an inlet flow field using a combination of diffusion tensor sets, alternating from strongly anisotropic to isotropic. FIG. 16B illustrates an inlet flow field using a combination of diffusion tensor sets, alternating from isotropic, to strongly anisotropic, to isotropic. FIG. 16C illustrates an inlet flow field using a combination of diffusion tensor sets, alternating from strongly anisotropic, to isotropic, to strongly anisotropic, back to isotropic. Lastly, FIG. 16D illustrates an inlet flow field using a combination of diffusion tensor sets resulting in an optimized microchannel design.

Figure 17:
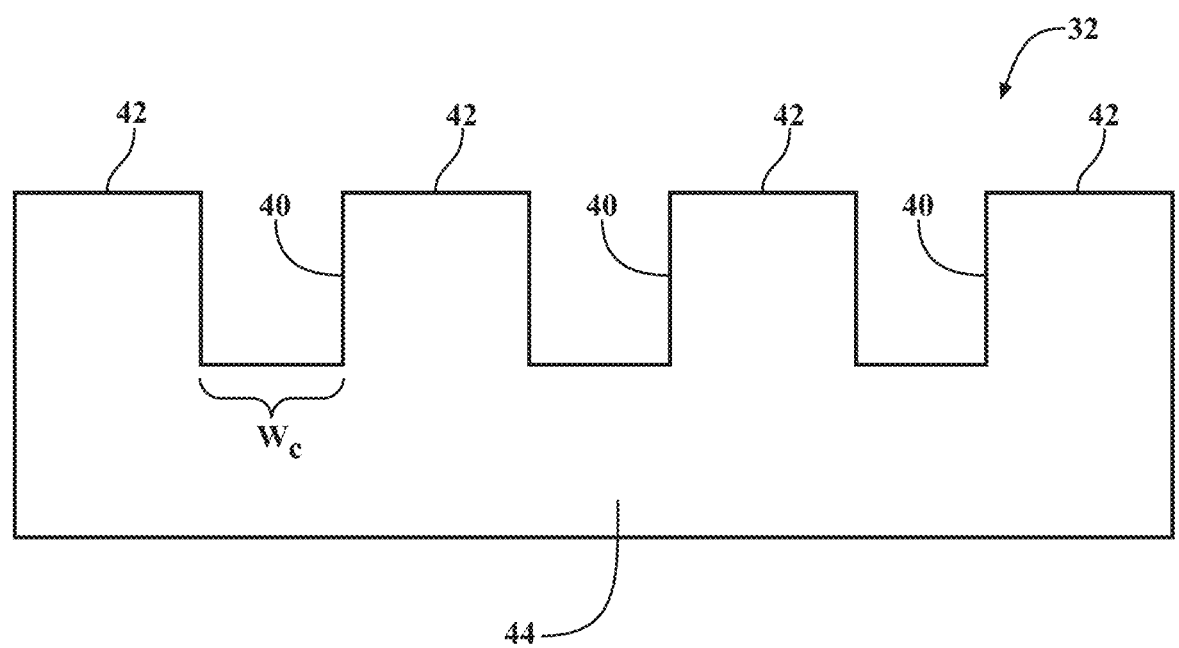
FIG. 17 illustrates a cross-section view of an exemplary set of channels and walls that can be made according to various manufacturing techniques.

Once an optimized microchannel layout and design is obtained and incorporated into a pattern, the present technology also provides for the manufacturing of the channels and creating the flow field of the bipolar plate, optionally with a tailored porosity. FIG. 17 provides a cross-section view of an exemplary set of basic channels 40, walls 42, and bottom wall 44 of an inlet region 32 of a flow field that can be made according to various manufacturing techniques. It should be understood that the specific design of the channels and walls can be quite detailed in various aspects.

Numerous materials and fabrication techniques can be used, in combination with the pattern, to create a network of a plurality of channels/microchannels 40 defined by a plurality of side walls 42 in various regions of a flow field. In various aspects, the present technology is particularly useful with functionally graded materials and/or microchannels, a porous media, or a hybrid combination thereof. A functionally graded material ("FGM"), also referred to as a functionally graded porous material, is generally known in the art as a material with a changing composition, microstructure, and/or porosity across a volume of the material, in one or more direction. FGMs can be specifically designed to perform a set of specified functions, and have almost endless possibilities for tailoring and customization, which can be very useful in making a flow field, or portion thereof, for a bipolar plate. Design parameters of the FGM can be used with the effective medium theory, as described above, in order to translate a FGM into a microchannel network, where at least one dimension of the microchannels, such as a width, is based on a permeability of the FGM. FGMs can generally be classified as being porosity and pore size gradient-structured, chemical/composition gradient-structured, and microstructural-gradient structured; each of which can be used singly or in combination with the flow field patterns designed herein. Not only does the present technology envision shaping and/or machining an existing FGM into a pattern, but also contemplates the creation of FGMs using additive manufacturing and similar techniques and technologies. For example, microstructural gradient functionally gradient material can be additive manufactured such that the microstructure is tailored so that different microstructures are produced in the material, which is made to change gradually, so as to achieve the desired properties from the material. In certain aspects, microstructural gradation can also be achieved during a solidification process using quenching. In other aspects, sintering techniques can be useful to produce a varying microstructure within a material.

In the broadest sense, additive manufacturing techniques can be used to make a pattern in the flow field, or portion thereof, where it is desired that at least a portion of the flow field is custom made and tailored to a specific design. Various non-limiting examples of additive manufacturing techniques include fabricating using laser sintering techniques, selective laser melting and electron-beam melting techniques, 3-D printing, and/or using binder jet technology that may use a combination of printing and curing. In other aspects, various electroplating techniques may also be used for fabricating or working with a functionally graded porous medium. Certain composite materials, polymers, thermoplastics, resins, and the like may be considered as useful materials, depending on the patterns and designs.

In still other aspects, metal inverse opal ("MIO") technology can be used with a suitable metal, such as copper, nickel, titanium, and the like. MIO technology can be tailored and customized as is known in the art. In one common example, a functionally graded porous medium can generally be obtained by templating polystyrene particles of different sizes, and/or controlling a sintering time for different templated regions. If desirable, MIO techniques can be used that create necks, pores, and fluidic routing structures exerting specific capillary forces, wicking, and flow patterns. Conventional metal machining and/or stamping techniques can be used in combination with the above techniques to ultimately provide the bipolar plates having flow fields with variable pitch microchannel designs.

Various hybrid porous structured materials and combinations of materials and methods of manufacture can also be used with the present technology. Hybrid porous structured materials may include a porous region and a non-porous region. Metal foams, and the like, may also be incorporated with designs of the present technology as a functionally graded porous material. In various aspects, dense, non-porous channel walls 42 can be provided with a coating of a porous material. Certain designs may include dense walls 42 with a porous bottom wall 44. In other aspects, the channel walls 42 may be made of a porous material or FGM, and the bottom wall 44 can be non-porous. The changes in porosity can also be gradient. In still other aspects, one or more regions of the bottom wall 44 can be designed to have a first degree of porosity, while the channel walls 42 may have a second degree of porosity, and so on. In certain aspects, the bottom wall 44 may be a part of the substrate or bipolar plate, and a plurality of microchannels may be subsequently created from a FGM, or formed on the bipolar plate using additive manufacturing, electroplating, or a combination thereof in order to create a variable pitch microchannel pattern configured to direct fluid from an inlet to an outlet.

The foregoing description is provided for purposes of illustration and description and is in no way intended to limit the disclosure, its application, or uses. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range, including the endpoints.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

What is claimed is:

1. A method for designing a microchannel layout for a flow field of a bipolar plate, the method comprising:
    defining a fluid flow optimization domain with boundary conditions and loads;
    using a gradient-based algorithm together with computational fluid dynamics to optimize the domain for minimum flow resistance;
    setting the minimum inverse permeability to a non-zero value, and obtaining a grayscale design and fluid velocity field;
    using Gray-Scott reaction diffusion equations with the grayscale design and fluid velocity field to obtain a microchannel layout; and
    incorporating the microchannel layout as a pattern for the flow field of the bipolar plate.

2. The method according to claim 1, comprising using Gray-Scott reaction diffusion equations with the grayscale design and fluid velocity field to obtain an anisotropic microchannel layout.

3. The method according to claim 2, wherein using Gray-Scott reaction diffusion equations comprises using an anisotropic diffusion tensor.

4. The method according to claim 3, comprising using a weak and strong anisotropic diffusion tensor set alternatively to obtain a connected line and space pattern for the microchannel layout.

5. The method according to claim 1, wherein a spacing of microchannels is based on effective medium theory.

6. The method according to claim 5, wherein the effective medium theory is used to translate a functionally graded porous material into a microchannel network, where at least one dimension of the microchannels is based on a permeability of the functionally graded porous material.

7. The method according to claim 1, wherein the gradient-based algorithm comprises one of a method of moving asymptotes (MMA) topology optimization and a globally convergent method of moving asymptotes (GCMMA) topology optimization.

8. The method according to claim 1, wherein flow field comprises a variable pitch microchannel pattern defined by a functionally graded porous material.

9. The method according to claim 8, wherein the flow field comprises a bottom wall and a plurality of side walls defining a plurality of microchannels, and the method comprises forming the plurality of side walls from a functionally graded porous material.

10. The method according to claim 8, comprising fabricating the functionally graded porous material using a metal inverse opal technique using at least one of copper, nickel, titanium, and combinations thereof.

11. The method according to claim 1, wherein incorporating the microchannel layout as a pattern for the flow field of the bipolar plate comprises using a combination of electroplating and additive manufacturing to create a hybrid structure bipolar plate with a variable pitch microchannel pattern to direct fluid from an inlet to an outlet.

12. The method according to claim 1, wherein incorporating the microchannel layout as a pattern for the flow field of the bipolar plate comprises using at least one additive manufacturing technique selected from the group consisting of laser sintering, electron-beam melting; binder jetting, and combinations thereof.

13. The method according to claim 1, wherein using a gradient-based algorithm together with computational fluid dynamics to optimize the domain for minimum flow resistance comprises using a modified Darcy flow equation for porous media.

14. A method for designing an anisotropic microchannel layout for a flow field of a bipolar plate, the method comprising:
   defining a fluid flow optimization domain with boundary conditions and loads;
   using a gradient-based algorithm together with computational fluid dynamics to optimize the domain for minimum flow resistance;
   setting the minimum inverse permeability to a non-zero value, and obtaining a grayscale design and fluid velocity field;
   using Gray-Scott reaction diffusion equations and an anisotropic diffusion tensor along with the grayscale design and fluid velocity field and to generate an anisotropic microchannel layout having a connected line and space pattern; and
   incorporating the anisotropic microchannel layout as a pattern for the flow field of the bipolar plate.

15. The method according to claim 14, comprising using a weak and strong anisotropic diffusion tensor set alternatively to solve the Gray-Scott reaction diffusion equations, and determining a spacing of microchannels based on effective medium theory.

16. A method for manufacturing a bipolar plate for a fuel cell, the method comprising:
   performing an interpolation process to design a flow distribution network, the interpolation process comprising:
      defining a fluid flow optimization domain with boundary conditions and loads;
      using a gradient-based algorithm together with computational fluid dynamics to optimize the domain for minimum flow resistance;
      setting the minimum inverse permeability to a non-zero value, and obtaining a grayscale design and fluid velocity field;
      using Gray-Scott reaction diffusion equations with the grayscale design and fluid velocity field to obtain a variable pitch microchannel flow field layout; and
   using at least one of an additive manufacturing technique, a metal inverse opal electroplating technique, and a hybrid combination thereof, to create the variable pitch microchannel flow field layout configured to direct fluid from an inlet to an outlet of the bipolar plate.

17. The method according to claim 16, comprising using Gray-Scott reaction diffusion equations and an anisotropic diffusion tensor along with the grayscale design and fluid velocity field to generate an anisotropic microchannel flow field layout.

18. The method according to claim 16, wherein using Gray-Scott reaction diffusion equations comprises using an anisotropic diffusion tensor.

19. The method according to claim 18, comprising using a weak and strong anisotropic diffusion tensor set alternatively to obtain a connected line and space pattern for the variable pitch microchannel flow field layout.

20. The method according to claim 16, comprising determining a spacing of microchannels based on effective medium theory.

* * * * *